United States Patent
Chantre et al.

(10) Patent No.: US 6,744,080 B2
(45) Date of Patent: Jun. 1, 2004

(54) METHOD OF MANUFACTURING A BIPOLAR TRANSISTOR OF DOUBLE-POLYSILICON, HETEROJUNCTION-BASE TYPE AND CORRESPONDING TRANSISTOR

(75) Inventors: Alain Chantre, Seyssins (FR); Helene Baudry, Grenoble (FR); Didier Dutartre, Meylan (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/097,651

(22) Filed: Mar. 13, 2002

(65) Prior Publication Data

US 2002/0185657 A1 Dec. 12, 2002

(51) Int. Cl.$^7$ ............................................... H01L 29/73
(52) U.S. Cl. ..................................................... 257/197
(58) Field of Search ............................... 438/170, 189, 438/235, 312, 313, 318, 320, 336, 339, 341, 343, 359, 360, 364, FOR 165

(56) References Cited

U.S. PATENT DOCUMENTS

| | | | | |
|---|---|---|---|---|
| 5,557,131 A | * | 9/1996 | Lee .............................. 257/370 |
| 5,773,350 A | * | 6/1998 | Herbert et al. ............... 438/364 |
| 6,251,738 B1 | * | 6/2001 | Huang ........................ 438/312 |
| 6,333,235 B1 | * | 12/2001 | Lee et al. .................... 438/309 |
| 6,461,925 B1 | * | 10/2002 | John et al. ................... 438/309 |
| 6,472,262 B2 | * | 10/2002 | Chantre et al. ............. 438/235 |
| 6,551,891 B1 | * | 4/2003 | Chantre et al. ............. 438/343 |

FOREIGN PATENT DOCUMENTS

EP 779664 A2 * 6/1997 ......... H01L/29/737

* cited by examiner

Primary Examiner—Allan R. Wilson
Assistant Examiner—Paul E Brock, II
(74) Attorney, Agent, or Firm—Lisa K. Jorgenson; Jon A. Gibbons; Fleit, Kain, Gibbons, Gutman, Bongini & Bianco P.L.

(57) ABSTRACT

Transistor and method of manufacturing a bipolar transistor of the double-polysilicon, heterojunction-base type, in which a semiconducting layer with SiGe heterojunction is formed by non-selective epitaxy on an active region of a substrate and an insulating region surrounding the active region. At least one stop layer is formed on the semiconducting layer above a part of the active region. A layer of polysilicon and an upper insulating layer are formed on the semiconducting layer and on a part of the stop layer, leaving an emitter window free. An emitter region is formed by epitaxy in the emitter window, resting partially on the upper insulating layer and in contact with the semiconducting layer.

12 Claims, 8 Drawing Sheets

METHOD OF MANUFACTURING A BIPOLAR TRANSISTOR OF DOUBLE-POLYSILICON, HETEROJUNCTION-BASE TYPE AND CORRESPONDING TRANSISTOR

CROSS REFERENCE TO RELATED APPLICATIONS

This application is based upon and claims priority from prior French Patent Application No. 0103469, filed Mar. 14, 2001, the disclosure of which is hereby incorporated by reference in its entirety.

BACKGROUND OF THE INVENTION

1. Field of the Invention

The invention relates to semiconductor components, especially those intended to be integrated into high-frequency technologies with a very high degree of integration (VLSI technology: "Very Large Scale Integration"), and especially bipolar transistors of the double-polysilicon, self-aligned, silicon/germanium heterojunction-base type, in particular those having an epitaxially grown base, and their method of manufacture.

2. Description of Related Art

A double-polysilicon transistor is formed with both the emitter and the extrinsic base made of polycrystalline silicon (polysilicon). In contrast a single-polysilicon bipolar transistor is formed with only the emitter made of polysilicon. Furthermore, a double-polysilicon transistor is said to be "self-aligned" when the distance between the polysilicon of the extrinsic base and the polysilicon of the emitter is not defined by any photolithography operation, stated differently, by any adjustment of two photolithography masks with respect to one another.

A conventional method of fabricating a self-aligned double-polysilicon bipolar transistor, in which the intrinsic base is implanted, is to deposit a stack of layers. This stack is deposited on an active area of a semiconducting substrate, having a given type of conductivity (for example N type). The stack of layers includes a layer of polysilicon heavily doped with a type of conductivity opposite to that of the substrate (for example P+ doped) surmounted by an upper insulating layer, for example of silicon dioxide. The P+ polysilicon layer is intended to form the extrinsic base of the transistor later. Next, the stack is etched above the active area so as to define an emitter window. Electrical-insulation regions or "spacers" are produced on the side faces of the emitter window and polysilicon is deposited in the emitter window in such a way as to form the emitter region. This emitter region is thus insulated from the extrinsic base by the internal spacers and also by a part of the upper insulating region of the stack on which this emitter region partially rests.

During the operation of etching of the stack, a problem of over-etching occurs which has the effect of removing some of the silicon from the active area. The control and the reproducibility of this over-etching are sufficient in the context of an implanted-base transistor, in which the implantation of the intrinsic base is generally carried out after the opening of the emitter window.

The problem of over-etching is different in a transistor with an epitaxially grown base, in particular if it is desired to have available an intrinsic base with silicon/germanium heterojunction. This is because, in transistors with an epitaxially grown base, non-selective epitaxy is generally used to deposit on the active area, and on the insulating regions delimiting this active area, a semiconducting region within which the future intrinsic base will be produced. The stack of layers set out above is then deposited on this first semiconducting region. However, the thickness of the first semiconducting region, that is to say the thickness of the intrinsic base, is particularly small, typically a few tens of nanometers. And this intrinsic base, already particularly thin at the outset, is inevitably partially etched as a result of the over-etching the stack when the emitter window is defined. This can lead to degradations in the electrical functioning of the transistor, or even to a defective transistor.

One solution to overcome this problem of over-etching consists of carrying out the epitaxial growth of the intrinsic base only after the emitter window has been etched. However, such a solution requires the use of selective epitaxy, which poses other, more intricate technological problems than for non-selective epitaxy, such as more intricate control of the thickness of the base, as well as greater difficulties in obtaining a high quality of the epitaxially grown base. Accordingly, a need exists to overcome this problem of over-etching in a transistor with an epitaxially grown base.

SUMMARY OF THE INVENTION

The present invention is a method to produce a transistor of the double-polysilicon, heterojunction-base type, which uses non-selective epitaxy of the base while remaining simple to fabricate and with good performance.

The method of fabricating a bipolar transistor of the double-polysilicon, heterojunction-base type, according to one aspect of the invention, comprises the following stages:

- a semiconducting layer with silicon/germanium heterojunction is formed by non-selective epitaxy on an active region of a semiconducting substrate and an insulating region surrounding the active region;
- at least one etching stop layer is formed on the heterojunction semiconducting layer above a part of the active region;
- a layer of polysilicon and an upper insulating layer can be on the heterojunction semiconducting layer and on a part of the stop layer, in such a way that an emitter window is left free; and
- an emitter region is formed by epitaxy in the emitter window, resting partially on the upper insulating layer and in contact with the heterojunction semiconducting layer. Spacers are advantageously formed in the emitter window.

The active region of the substrate can be prepared beforehand by ion implantation in order to form n+ type and p+ type buried layers, an epitaxially grown collector of n type, and an insulating region.

In one embodiment of the invention, it is possible to form a lower insulating layer, beforehand, covering the active region and the insulating region surrounding the active region, and to etch the insulating layer in order to define an aperture above the active region and a part of the insulating region surrounding the active region. The insulating layer may comprise silicon oxide, silicon oxynitride and/or amorphous silicon.

In another embodiment of the invention, the silicon/germanium heterojunction semiconducting layer is formed in the aperture directly on the active region.

In still another embodiment of the invention, a lower stop layer and an upper stop layer are formed with compositions such that they can be etched selectively. The lower stop layer may includes silicon oxide and the upper stop layer includes silicon nitride. The stop layers are formed by deposition then etching. The upper surface of the heterojunction semiconducting layer is cleaned in order to remove from it any traces of oxide, for example with hydrofluoric acid.

In yet still another embodiment of the invention, the polysilicon layer is deposited non-selectively, then is doped in order to form p+ type conductivity on it, then the upper insulating layer is deposited non-selectively, then the upper insulating layer and the polysilicon layer are etched selectively above a part of the etching stop layer, the etching being stopped substantially on the etching stop layer. The polysilicon layer is doped with boron. The upper insulating layer is silicon oxide. Etching, such as anisotropic etching, is performed. It is then possible to dope a part of the active region by an N type species such as phosphorus or arsenic which will pass through the etching stop layer or layers.

The spacers are formed by deposition of an insulating material in the emitter window, then by etching, leaving behind the insulating material on the edges of the window. The insulating material is preferably identical to the material forming the upper stop layer. Etching removes the upper stop layer situated in the bottom and at the center of the emitter window. Dry etching is preferable.

In one embodiment of the invention, prior to the stage of forming the emitter region, the lower stop layer situated in the bottom and at the center of the emitter window is etched selectively with respect to the heterojunction semiconducting layer so as to clear the heterojunction semiconducting layer.

In another embodiment of the invention, a layer of doped polysilicon is deposited in order to form an emitter region.

In still another embodiment of the invention, the layer of polysilicon is deposited non-selectively, followed by the layer of polysilicon. The upper insulating layer is etched anisotropically.

Advantageously, the polysilicon layer is of n+ type conductivity.

In one embodiment of the invention, the polysilicon layer is doped with arsenic.

Subsequently to the stage of forming the emitter region, the present invention makes it possible to remove by etching the polysilicon layer and the heterojunction semiconducting layer outside the active region and from a part of the insulating region surrounding the active region. It is possible to remove the lower insulating layer likewise outside the active region and from a part of the insulating region surrounding the active region.

An annealing is carried out in order to activate the implanted species. Spacers can be formed on the edges of the polysilicon layer and the heterojunction semiconducting layer and on the edges of the lower insulating layer, for example by depositing a supplementary insulating layer and isotropic etching. A metallic layer is deposited, comprising titanium for example, on the surface of the polysilicon layer and of the emitter region in order to ensure a high-quality electrical contact.

The invention likewise provides a bipolar transistor of the double-polysilicon, heterojunction-base type, comprising an active region of a semiconducting substrate and an insulating region surrounding the active region, an epitaxially grown silicon/germanium heterojunction semiconducting layer arranged on the active region and a part of the insulating region, at least one etching stop layer arranged on the heterojunction semiconducting layer above a part of the active region, a polysilicon layer arranged on the heterojunction semiconducting layer and on a part of the stop layer and an upper insulating layer on a part of the polysilicon layer, the upper insulating layer and the polysilicon layer leaving free an emitter window, spacers arranged in the emitter window, and an epitaxially grown emitter region arranged in the emitter window, resting partially on the upper insulating layer and in contact with the heterojunction semiconducting layer.

The active region of the substrate may comprise n+ and p+ type buried layers, an epitaxially grown collector of n type, and the insulating region can be formed by the shallow-trench method, known as STI (Shallow Trench Isolation).

In one embodiment of the invention, the transistor comprises a lower insulating layer partly covering the insulating region surrounding the active region while being provided with an aperture above the active region and a part of the insulating region.

The insulating region is preferably silicon oxide, silicon oxide nitride and/or amorphous silicon.

The silicon/germanium heterojunction semiconducting layer is preferably in direct contact with the active region.

In one embodiment of the invention, the transistor comprises a lower stop layer and an upper stop layer with compositions such that the stop layers can be etched selectively.

The lower stop layer may comprise silicon oxide and the upper stop layer may comprise silicon nitride. The stop layers are formed by deposition then etching. It is then possible to clean the upper surface of the heterojunction semiconducting layer in order to remove from it any traces of oxide, for example with hydrofluoric acid.

The polysilicon layer comprises a doping species in order to confer on it conductivity of p+ type. The polysilicon layer can be doped with boron. The upper insulating layer may comprise silicon oxide.

In one embodiment of the invention, the spacers comprise the same material as the upper stop layer.

In one embodiment of the invention, the emitter region comprises a doping species of n+ type conductivity. In one embodiment of the invention, the polysilicon layer is doped with arsenic.

BRIEF DESCRIPTION OF THE DRAWINGS

The subject matter which is regarded as the invention is particularly pointed out and distinctly claimed in the claims at the conclusion of the specification. The foregoing and other features, and advantages of the invention will be apparent from the following detailed description taken in conjunction with the accompanying drawings.

DETAILED DESCRIPTION OF AN EMBODIMENT

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements maybe in the plural and vice versa with no loss of generality.

Figure 1:
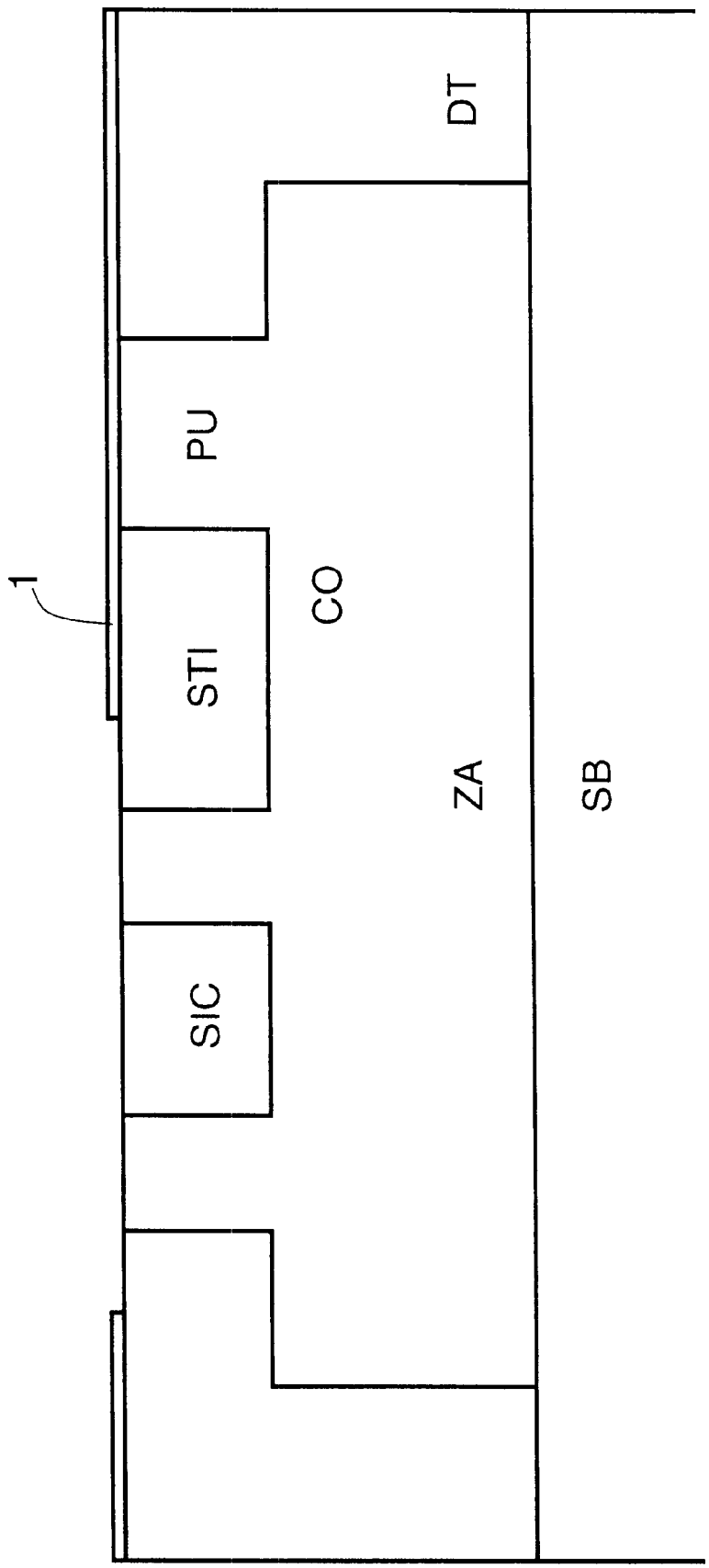
FIGS. 1 to 8 illustrate the principal stages of a method of fabricating a transistor according to the invention, FIG. 8 furthermore, illustrates an embodiment of a transistor according to the invention.

In FIG. 1, the reference SB designates a semiconducting substrate, for example of silicon, having N type conductivity in the present case. In a way which is conventional and known in itself, an active area ZA is delimited within this substrate SB by producing insulating regions STI on either side of this region ZA, for example by a method known to the person skilled in the art by the title of "Shallow Trench Isolation". This active area will form the intrinsic collector of the transistor.

In a way which is known in itself, the active area ZA comprises N+ and P+ type buried layers, an epitaxially grown N type collector CO provided with a contact well PU. The active area is insulated from adjacent active areas, not represented, by deep insulating areas DT, obtained, for example, by a method known to the person skilled in the art by "Deep Trench Isolation". The STI insulating regions could also be formed by the method known by the name of LOCOS. Finally, a part SIC of the active area ZA is the subject of localized over-doping. The localized over-doping can be carried out in part at this stage then be refined later, see below. The part SIC is provided at the place where the emitter will be formed.

Next a lower insulating layer 1 is deposited non-selectively. The lower insulating layer 1 may comprise silicon oxide or amorphous silicon or even, and preferably, a double layer formed by a lower part of silicon oxide and by an upper part of amorphous silicon. The lower insulating layer 1 is etched in order to form an aperture above the active region ZA, especially the part SIC, and, advantageously, a part of the insulating region STI in the vicinity of the active region ZA.

Next a heterojunction semiconducting region 2 is made to grow by non-selective epitaxy. The non-selective epitaxy is characterized by a growth of this semiconducting region not only on the active area ZA but also on the insulating regions STI and on the insulating layer 1.

The silicon/germanium heterojunction semiconducting region 2, which typically has a thickness of a few tens of nanometers, for example between 50 and 80 nm, in fact consists of several superimposed layers. Hence, non-selective epitaxy of a first undoped silicon layer is carried out. Next a second layer is grown epitaxially, formed by silicon/germanium, this second layer being composed, for example, of a first sub-layer of Si1-xGex with x a constant lying between 0.1 and 0.2 surmounted by a second sub-layer likewise formed from an alloy of Si1-xGex (with x decreasing down to 0, for example) and P doped by boron. The second layer is then surmounted by an epitaxially grown layer of silicon P doped by boron.

On completion of this epitaxy, typically carried out at 700° in an ultra-clean CVD deposition reactor, a stack of layers is obtained making it possible to form a silicon/germanium heterojunction intrinsic base. It will be understood that, above the active area ZA, the layer 2 exhibits a monocrystalline form, while, outside the active area ZA, that is to say above the insulating regions STI and the lower insulating layer 1, the layer 2 exhibits a polycrystalline form due to the absence of silicon monocrystal at the start of the epitaxy.

Next, a lower etching stop layer 3 is deposited non-selectively, then an upper etching stop layer 4. The lower layer 3 may comprise silicon oxide, while the upper layer 4 may comprise silicon nitride. Alternatively, the lower layer 3 may comprise silicon oxynitride, while the upper layer 4 comprises silicon nitride. Alternatively, the lower layer 3 may comprise silicon oxide, while the upper layer 4 comprises silicon oxynitride. Other combinations can also be envisaged, the upper layer 4 possibly being etched selectively with respect to the lower layer 3, and the lower layer 3 with respect to this semiconducting layer 2.

Figure 2:
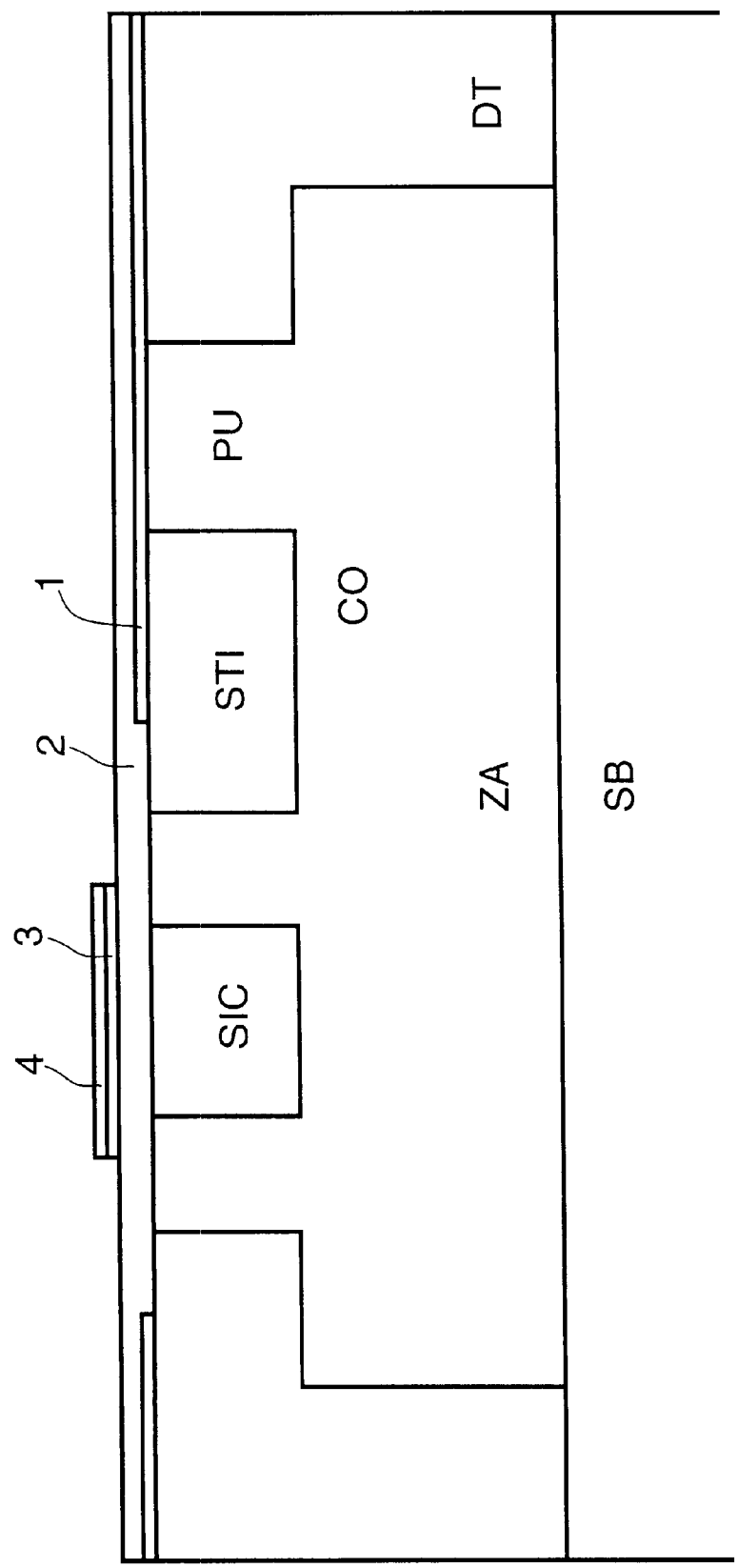

Next a stage of lithography is carried out, for example with dry etching by plasma in order to take off the upper layer 4 selectively with respect to the lower layer 3. The upper layer 4 is left behind above the over-doped part SIC of the active area as well as above a part of the active area adjacent to the over-doped part SIC. Then the resin which has served for the lithography is removed, then etching is carried out, for example of chemical type, in order to take away the lower layer 3 selectively with respect to the semiconducting layer 2. The etching leaves behind the lower layer 3 in the same places as the upper layer 4, see FIG. 2.

Next a stage of cleaning of the upper surface of the stack is carried out in order to remove any silicon oxide residues from it and thus to enhance the electrical contact between the semiconducting layer 2 and the layer which will be deposited subsequently. The cleaning can be carried out with the aid of hydrofluoric acid HF.

Next, non-selective deposition of a polysilicon layer 5 is carried out, this layer being intended to form the extrinsic base of the bipolar transistor. The polysilicon layer 5 is then P+ doped, for example with boron, in such a way that the dopant does not pass through the upper stop layer 4, this being done so as to avoid over-doping of the part of the semiconducting layer 2 which is situated under the stop layers 3 and 4. Next, an upper insulating layer 6 is deposited, non-selectively, for example made of silicon oxide.

Figure 3:
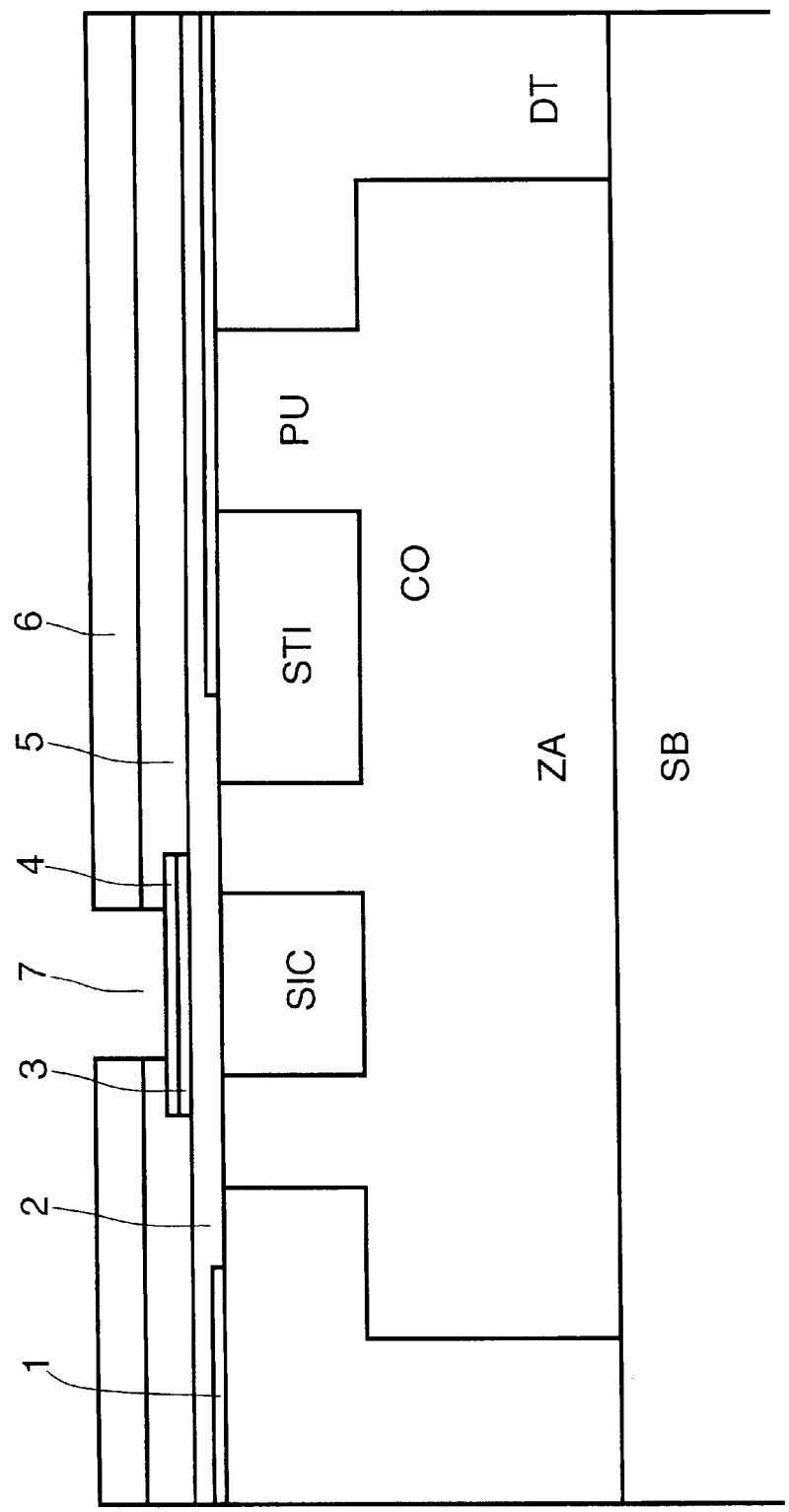

Next the layer 6 then the layer 5 are etched in order to open an emitter window 7 above a part of the upper stop layer 4 and substantially aligned with the over-doped part SIC of the active area ZA. The etching can be carried out by lithography using a mask and two different etching chemistries, one for the insulating layer 6 and the other for the polysilicon layer 5. In other words, the insulating layer 6 is etched first of all, stopping on the polysilicon layer 5, this being done while it is possible to use etching chemistry which is not selective with respect to the polysilicon layer 5. Then the polysilicon layer 5 is etched selectively with respect to the upper stop layer 4, see FIG. 3.

At this stage, if the over-doping of the part SIC of the active area ZA has still not been carried out, or if it is desired to control precisely the doping of the collector at the base/collector junction, it is possible to provide for a doping-species implantation operation, able to pass through the upper stop layer 4, the lower stop layer 3 and the semiconducting layer 2 in order to reach the active area ZA.

Figure 4:
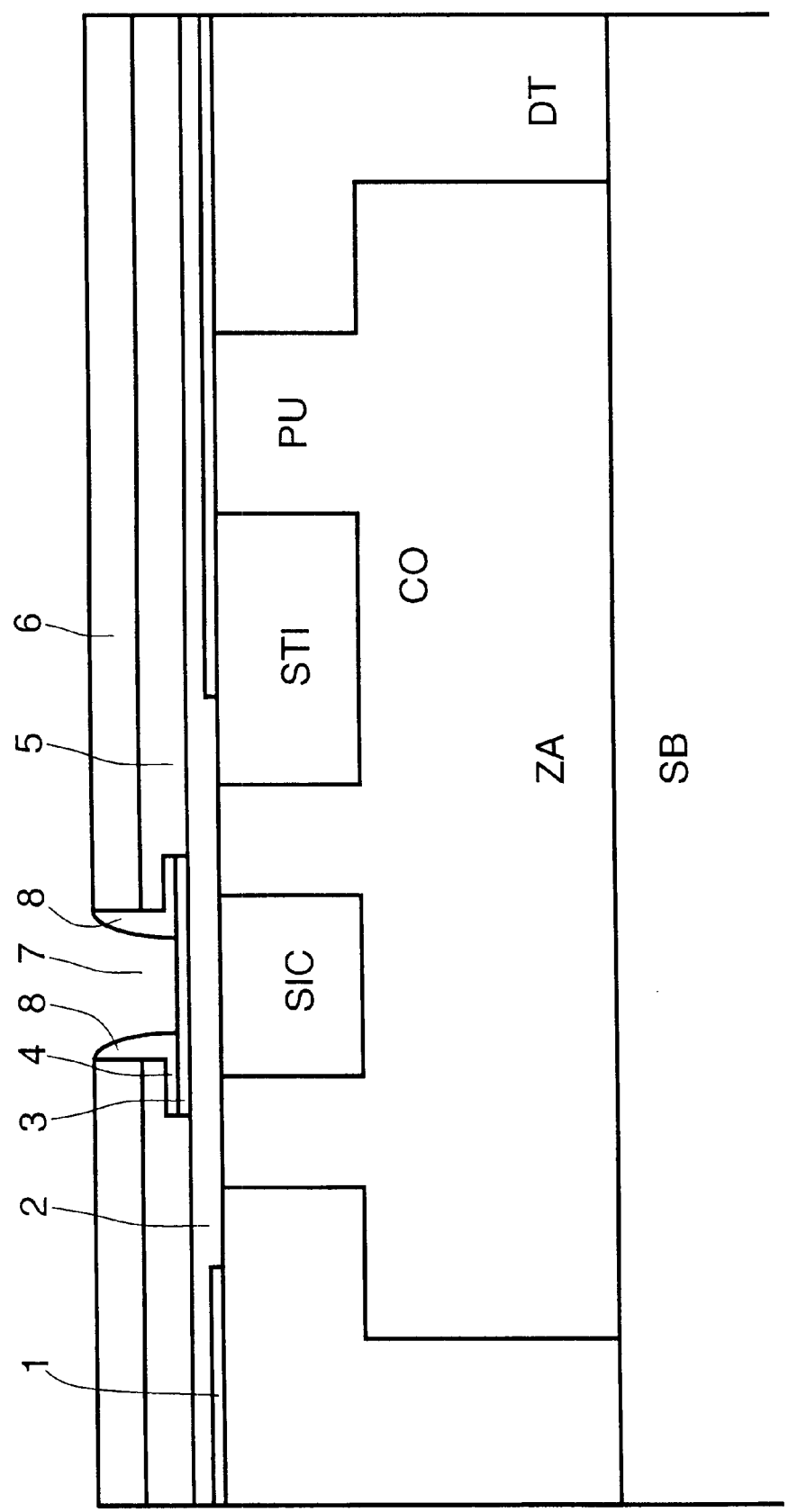

Next the emitter window 7 is filled in with a material identical to that constituting the upper stop layer 4, for example of silicon nitride Si3N4. The depositing of this material can take place non-selectively over the whole of the stack. Then etching of the material is carried out selectively with respect to the upper insulating layer 6 and with respect to the lower stop layer 3, for example an anisotropic etching, especially a dry etching in such a way that it leaves behind spacers 8 on the edges of the emitter window 7 while completely clearing the bottom of the emitter window 7, see FIG. 4.

Next, wet etching of the lower stop layer 3 situated at the bottom of the emitter window 7 is carried out in order to reach the semiconducting layer 2.

Figure 5:
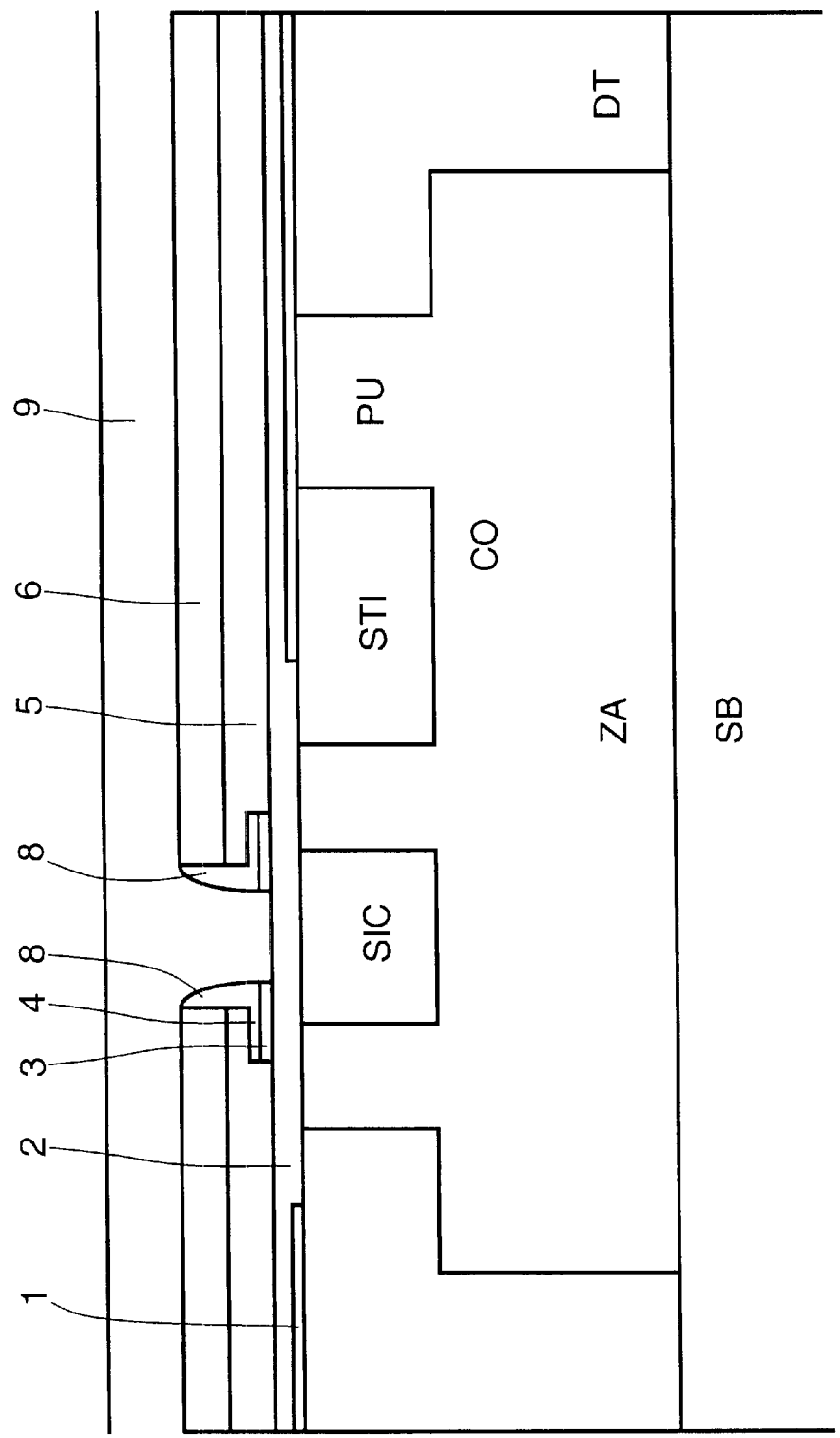

Next a layer of polysilicon 9 is deposited on the whole of the stack in such a way that it fills in the emitter window 7, see FIG. 5. The polysilicon layer 9 is advantageously N+ doped when it is deposited. The doping during the deposition can be carried out by introduction of arsine into the reactor in which the stack is arranged at the same time as the introduction of the gases allowing the formation of the polysilicon. Thus, a good distribution of the arsenic is encouraged in the polysilicon layer 9. Furthermore, the deposition of the polysilicon layer 9 doped with arsenic can take place after a deoxidizing treatment, for example a heat treatment under hydrogen, in the same reactor, which guarantees excellent cleanliness and the absence of silicon oxide in the bottom of the emitter window 7 during the deposition of the silicon layer 9.

Figure 6:
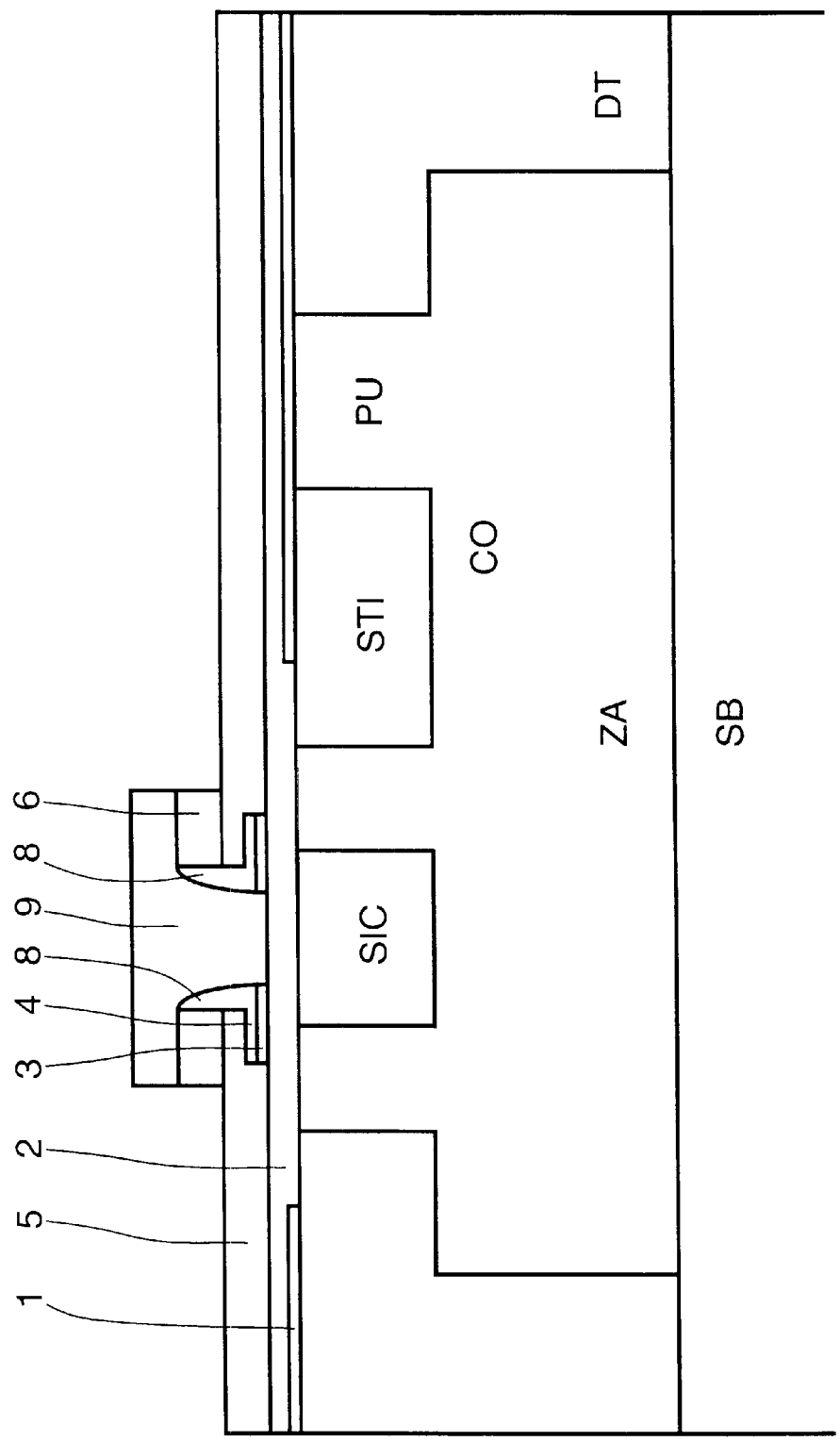

Next a double stage of etching by means of a single mask and of two different etching chemistries is carried out, first of all in order to etch the polysilicon layer 9 and to take it out of the emitter window 7 and an adjacent area, then to take off the upper insulating layer 6 at the same places as the polysilicon layer 9, see FIG. 6. This double etching stage is therefore economical and relatively quick.

Next a stage of lithography of the polysilicon layer 5 is carried out, in such a way that it remains behind above the active area ZA and an adjacent area comprising the entire aperture defined in the lower insulating layer 1 and a part of the lower insulating layer 1. Next, an etching of the semiconducting layer 2 is carried out at the same place as the polysilicon layer 5, and finally etching of the lower insulating layer 1 at the same place as before. The etching is stopped on the insulating regions STI, as well as on the collector well PU.

In a way which is known in itself, it is then possible to carry out the activation of the implanted species by annealing.

Next spacers 10 are formed on the edges of the remaining portions of the lower insulating 1, semiconducting 2 and polysilicon 5 layers on the one hand, and upper insulating 6 and polysilicon 9 layers, on the other hand. The forming of the spacers 10 can be carried out by non-selective deposition of a layer of silicon oxide followed by a stage of isotropic etching.

Figure 7:
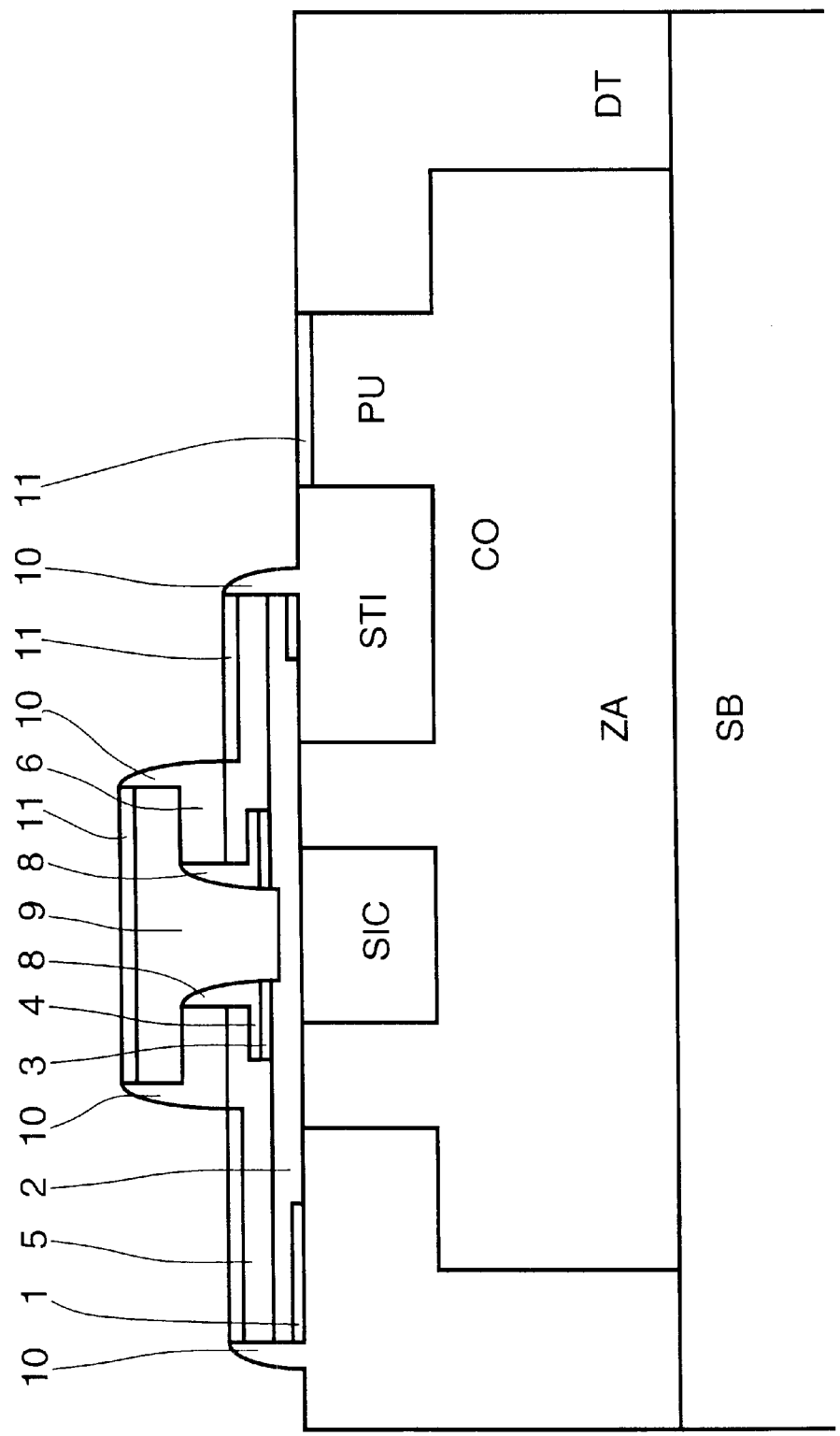

Next a stage of titanium deposition is carried out, then a stage of heat treatment in order to form a layer 11 of TiSi2 compound at the places where the titanium is in contact with polycrystalline silicon, then a stage of selective chemical removal of the metal titanium while preserving the TiSi2 compound, which makes it possible to enhance the electrical contacts on the surface of the collector well PU of the polysilicon layer 5 forming the extrinsic base of the transistor and of the polysilicon layer 9 forming the emitter of the transistor, see FIG. 7.

Figure 8:
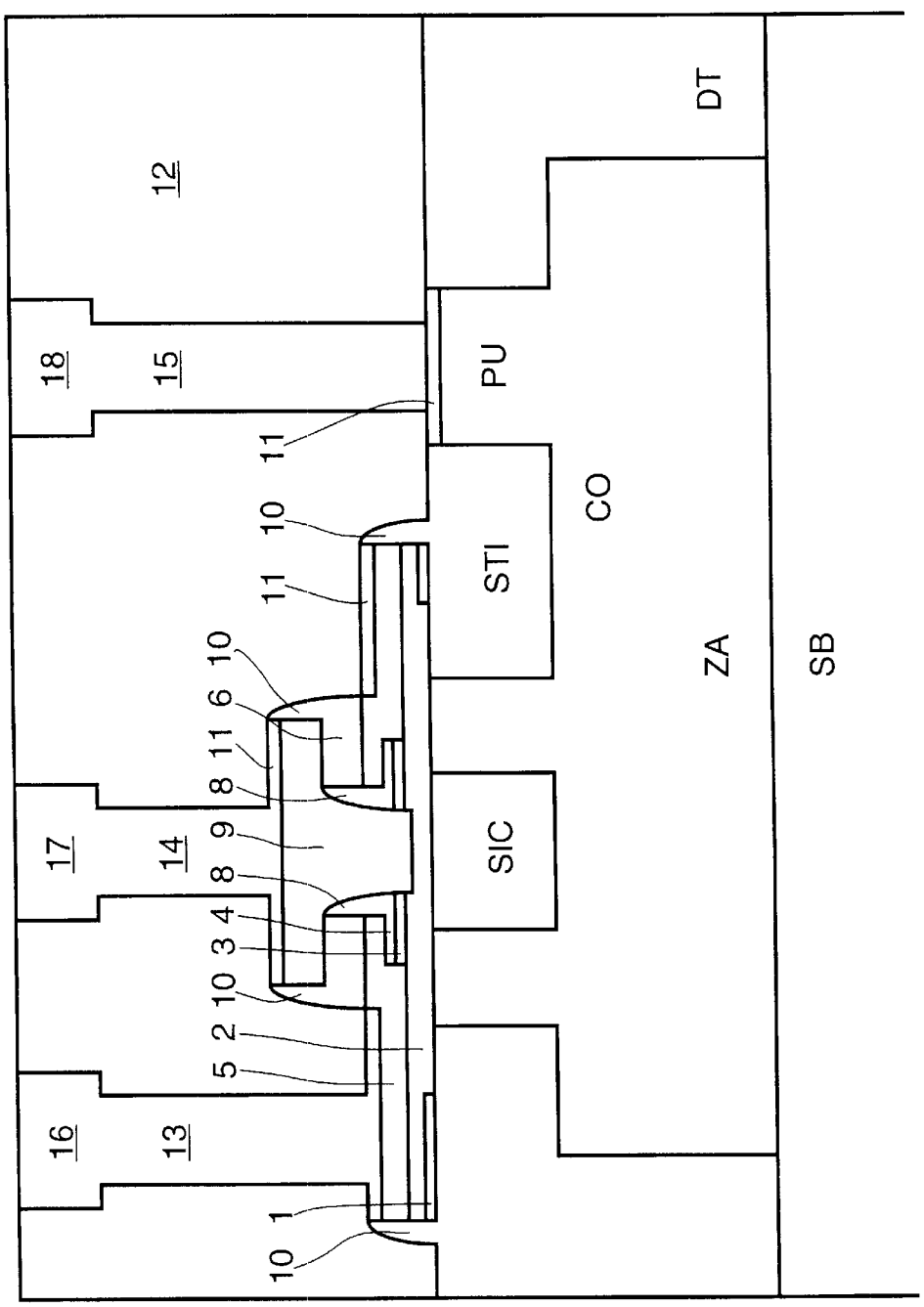

It is then possible to carry out deposition of a thick dielectric layer 12, non-selectively, then to form vias 13, 14 and 15 making it possible to reach the extrinsic base of the transistor, the emitter and the collector respectively. The vias 13, 14 and 15 can then be surmounted by contact lands 16, 17 and 18 respectively, see FIG. 8.

By virtue of the invention, a vertical bipolar transistor is produced with non-selectively epitaxially grown Si/SiGe base with a virtually self-aligned emitter/base structure, but without suffering the complexity of self-alignment. The epitaxially grown emitter makes it possible to obtain a transistor having excellent performance, especially low 1/fnoise, low emitter resistance, excellent reproducibility of fabrication and excellent control of characteristics during fabrication.

It is particularly advantageous to grow the layer 9 forming the emitter epitaxially in the reactor in which the stack has undergone the deoxidizing treatment stage, especially of the bottom of the emitter window 7 making it possible locally to eliminate the lower stop layer 3 and to reach the semiconducting layer 2. It is thus possible to avoid any intake of air and therefore of oxygen risking forming silicon oxides at the bottom of the emitter window on the cleared surface of the semiconducting layer 2.

A bipolar transistor thus fabricated makes it possible to reach very high performance with a transition frequency fT possibly reaching 70 GHz and a maximum frequency possibly reaching 90 GHz. Furthermore, the fabrication process is compatible with BiCMOS methods. And there is a benefit from the unique sequence of fabrication of the emitter and of the base by virtue of the epitaxy of the emitter with a very thin emitter/basejunction, of the order of 15 nm, giving reduced emitter/base capacitance. The junction depth is easily reproducible by virtue of the absence of interfacial oxide and of the in-situ doping of the layer forming the emitter, giving excellent reproducibility from one fabrication batch to another.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A method of fabricating a bipolar double-polysilicon, heterojunction-based transistor comprising:

forming a semiconducting layer with silicon/germanium heterojunction on an active region of a semiconducting substrate and on an insulation region surrounding the active region;

depositing at least one etching stop layer on the semiconducting layer so as to be above a part of the active region:

forming a polysilicon layer and an upper insulating layer on the semiconducting layer and on a part of the stop layer so as to produce an emitter window; and forming an emitter region in the emitter window so as to rest partially on the upper insulating layer and in contract with the semiconducting layer.

2. The method according to claim 1, wherein the step of forming the semiconducting layer includes forming the semiconducting layer by non-selective epitaxy.

3. The method according to claim 1, wherein the step of forming the emitter region includes forming the emitter region by epitaxy.

4. The method according to claim 1, wherein the step of forming the semiconducting layer further includes the steps of:

depositing a lower insulating layer which covers the active region and a region surrounding the active region; and etching an aperture in the lower insulating layer so that the aperture is above the active region and a part of the lower insulating region surrounding the active region.

5. The method according to claim 4, wherein the step of forming the semiconducting layer includes forming the semiconducting layer in the aperture directly on the active region.

6. The method according to claim 1, where in the step of depositing the least one etching stop layer includes:

forming a lower stop layer; and forming an upper stop layer;

wherein the lower stop layer and the upper stop layer are each formed from different compositions which can be selectively etched with respect to each other.

7. The method according to claim 5, where in the step of depositing the least one etching stop layer includes:

forming a lower stop layer; and forming an upper stop layer;

wherein the lower stop layer and the upper stop layer are each formed from different compositions which can be selectively etched with respect to each other.

8. The method according to claim 1, wherein the step of forming the polysilicon layer includes the steps of:

depositing non-selectively the polysilicon layer;

doping the polysilicon layer so as to provide p+ type conductivity;

depositing an upper insulating layer non-selectively; and etching the upper insulating layer and the polysilicon layer selectively above a part of the etching stop layer so that the etching is stopped substantially on the etching stop layer.

9. The method according to claim 7, wherein the step of forming the polysilicon layer includes the steps of:

depositing non-selectively the polysilicon layer;

doping the polysilicon layer so as to provide p+ type conductivity;

depositing the upper insulating layer non-selectively; and etching the upper insulating layer and the polysilicon layer selectively above a part of the etching stop layer so that the etching is stopped substantially on the etching stop layer.

10. The method according to claim 6, wherein the step of forming the lower stop layer includes forming the lower stop layer in the bottom area of where the emitter window is subsequently formed and wherein the emitter window is etched selectively with respect to the semiconducting layer so as to clear the semiconducting layer.

11. The method according to claim 9, wherein the step of forming the lower stop layer includes forming the lower stop layer in a bottom area of the emitter window and wherein the emitter window is etched selectively with respect to the semiconducting layer so as to clear the semiconducting layer.

12. The method according to claim 11, wherein the step of forming the emitter region includes forming the emitter region with a doped polysilicon layer.

* * * * *

UNITED STATES PATENT AND TRADEMARK OFFICE
CERTIFICATE OF CORRECTION

PATENT NO.   : 6,744,080 B2
DATED        : June 1, 2004
INVENTOR(S)  : Alain Chantre et al.

It is certified that error appears in the above-identified patent and that said Letters Patent is hereby corrected as shown below:

<u>Title page,</u>
Insert Item:
-- [30]  Foreign Application Priority Data
Mar. 14, 2001  (FR) ..................... 0103469 --

Signed and Sealed this

Twentieth Day of July, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,744,080 B2  
APPLICATION NO. : 10/097651  
DATED : June 1, 2004  
INVENTOR(S) : Alain Chantre et al.

Page 1 of 1

It is certified that error appears in the above-identified patent and that said Letters Patent is hereby corrected as shown below:

Please make the following change:

Column 8, Claim 1, Line 43, from "contract" to --contact--

Signed and Sealed this

Twenty-fourth Day of June, 2008

JON W. DUDAS  
*Director of the United States Patent and Trademark Office*